United States Patent
Oh et al.

(10) Patent No.: US 11,894,189 B2
(45) Date of Patent: Feb. 6, 2024

(54) CAPACITOR COMPONENT AND METHOD OF MANUFACTURING THE SAME

(71) Applicant: SAMSUNG ELECTRO-MECHANICS CO., LTD., Suwon-si (KR)

(72) Inventors: Young Joon Oh, Suwon-si (KR); Jeong Ryeol Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 219 days.

(21) Appl. No.: 17/569,027

(22) Filed: Jan. 5, 2022

(65) Prior Publication Data
US 2023/0071865 A1 Mar. 9, 2023

(30) Foreign Application Priority Data
Aug. 27, 2021 (KR) .................. 10-2021-0114068

(51) Int. Cl.
*H01G 4/008* (2006.01)
*C22C 1/04* (2023.01)
*H01G 4/30* (2006.01)
*H01G 4/12* (2006.01)
*H01L 49/02* (2006.01)

(52) U.S. Cl.
CPC .............. *H01G 4/008* (2013.01); *C22C 1/04* (2013.01); *H01G 4/12* (2013.01); *H01G 4/30* (2013.01); *H01L 28/60* (2013.01)

(58) Field of Classification Search
CPC . C22C 1/04; H01G 4/008; H01G 4/12; H01G 4/30
See application file for complete search history.

(56) References Cited

U.S. PATENT DOCUMENTS

| 2004/0256603 | A1 | 12/2004 | Celik et al. | |
| 2011/0031448 | A1* | 2/2011 | Ota | B22F 1/00 252/512 |
| 2019/0311853 | A1 | 10/2019 | Kim et al. | |

FOREIGN PATENT DOCUMENTS

| JP | 2014-145117 A | 8/2014 |
| KR | 10-0950127 B1 | 3/2010 |
| KR | 10-2019-0118293 A | 10/2019 |

* cited by examiner

*Primary Examiner* — Nathan Milakovich
(74) *Attorney, Agent, or Firm* — MORGAN, LEWIS & BOCKIUS LLP

(57) ABSTRACT

A capacitor component includes a body, including a dielectric layer and an internal electrode layer, and an external electrode disposed on the body and connected to the internal electrode layer. The internal electrode layer includes zirconium (Zr) and germanium (Ge). A ratio of a sum of contents (at %) of zirconium (Zr) and germanium (Ge), contained in the internal electrode layer, to an entirety of the internal electrode layer is 3.3 at % or more to 3.7 at % or less.

21 Claims, 8 Drawing Sheets

CAPACITOR COMPONENT AND METHOD OF MANUFACTURING THE SAME

CROSS-REFERENCE TO RELATED APPLICATION(S)

The present application claims the benefit of priority to Korean Patent Application No. 10-2021-0114068, filed on Aug. 27, 2021 in the Korean Intellectual Property Office, the entire disclosure of which is incorporated herein by reference.

TECHNICAL FIELD

The present disclosure relates to a capacitor component and a method of manufacturing the same.

BACKGROUND

A multilayer ceramic capacitor (MLCC), a type of capacitor component, is an important chip component used in industrial areas relating to communications, computing, home appliances, automobiles, and the like, due to advantages thereof such as compactness, guaranteed high capacitance, and desirable mountability characteristics. In particular, an MLCC is a core passive component used in various electric, electronic, and information communications devices such as mobile phones, computers, digital televisions (TVs), and the like.

In general, an MLCC is manufactured by screen-printing a conductive paste for forming an internal electrode layer on a dielectric green sheet, laminating a plurality of dielectric green sheets on which the conductive paste is printed, and sintering the plurality of dielectric green sheets. In general, the conductive paste is prepared by mixing conductive powder particles such as nickel (Ni), ceramic powder particles, a binder, a solvent, and the like, with each other.

SUMMARY

An aspect of the present disclosure is to provide a capacitor component which may improve connectivity of an internal electrode layer.

Another aspect of the present disclosure is to provide a capacitor component which may increase capacitance.

Another aspect of the present disclosure is to provide a capacitor component which may improve moisture resistance reliability.

According to an aspect of the present disclosure, a capacitor component includes a body, including a dielectric layer and an internal electrode layer, and an external electrode disposed on the body and connected to the internal electrode layer. The internal electrode layer includes zirconium (Zr) and germanium (Ge). A ratio of a sum of contents (at %) of zirconium (Zr) and germanium (Ge), contained in the internal electrode layer, to an entirety of metal content the internal electrode layer is 3.3 at % or more to 3.7 at % or less.

According to an aspect of the present disclosure, a capacitor component includes a body including a dielectric layer and an internal electrode layer and an external electrode disposed on the body and connected to the internal electrode layer. The internal electrode layer includes a nickel (Ni)-zirconium (Zr)-germanium (Ge) alloy, and a ratio of a sum of contents (at %) of zirconium (Zr) and germanium (Ge), contained in the internal electrode layer, to a content (at %) of nickel (Ni), contained in the internal electrode layer, is 3.8 at % or more to 4.3 at % or less.

According to an aspect of the present disclosure, a method of manufacturing a capacitor component includes forming a dielectric green sheet and applying a conductive paste to the dielectric green sheet, the conductive paste including first powder particle including nickel (Ni), second powder particles including zirconium (Zr), and third powder particles including germanium (Ge).

According to an aspect of the present disclosure, a capacitor component includes a body including a dielectric layer and an internal electrode layer and an external electrode disposed on the body and connected to the internal electrode layer. The internal electrode layer includes zirconium (Zr) and germanium (Ge), and a content of germanium (Ge), contained in the internal electrode layer, is higher than a content of zirconium (Zr) contained in the internal electrode layer.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
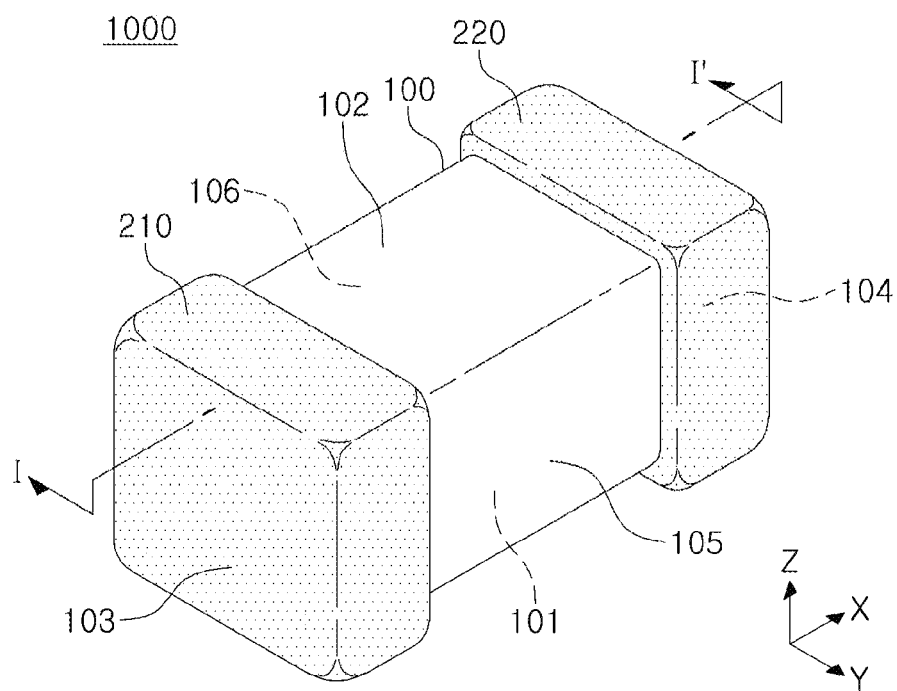
FIG. 1 is a schematic perspective view of a capacitor component according to an exemplary embodiment of the present disclosure.

The terms used in the description of the present disclosure are used to describe a specific embodiment, and are not intended to limit the present disclosure. A singular term includes a plural form unless otherwise indicated. The terms "include," "comprise," "is configured to," etc. of the description of the present disclosure are used to indicate the presence of features, numbers, steps, operations, elements, parts, or combination thereof, and do not exclude the possibilities of combination or addition of one or more additional features, numbers, steps, operations, elements, parts, or combination thereof. Also, the terms "disposed on," "positioned on," and the like, may indicate that an element is positioned on or beneath an object, and does not necessarily mean that the element is positioned above the object with reference to a direction of gravity.

Terms such as "coupled to," "combined to," and the like, may not only indicate that elements are directly and physically in contact with each other, but also include the configuration in which another element is interposed between the elements such that the elements are also in contact with the other component.

Sizes and thicknesses of elements illustrated in the drawings are indicated as examples for ease of description, and the present disclosure are not limited thereto.

In the drawings, a first direction may be defined as a T direction or a thickness direction, a second direction may be defined as an L direction or a length direction, and a third direction may be defined as a W direction or a width direction.

Hereinafter, a capacitor component and a method of manufacturing the same according to an exemplary embodiment of the present disclosure will be described in detail with reference to the accompanying drawings. Referring to the accompanying drawings, the same or corresponding components may be denoted by the same reference numerals, and overlapped descriptions will be omitted.

Figure 2:
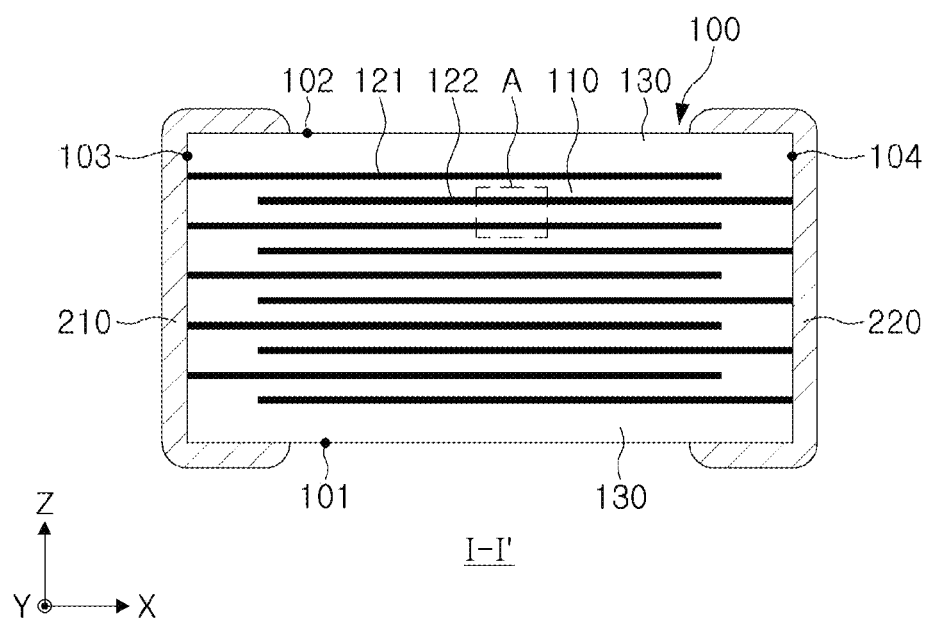
FIG. 2 is a schematic cross-sectional view taken along line I-I' of FIG. 1.
Figure 3:
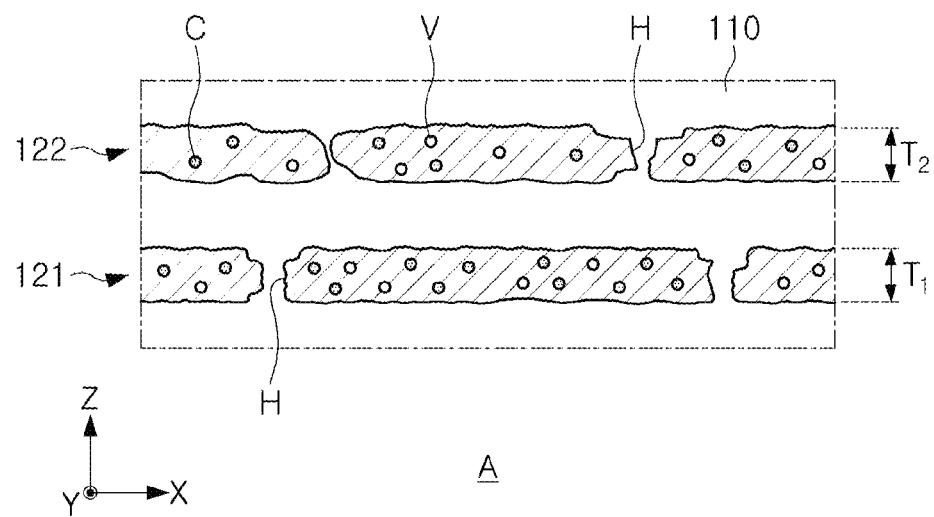
FIG. 3 is an enlarged view of portion "A" of FIG. 2.
Figure 4:
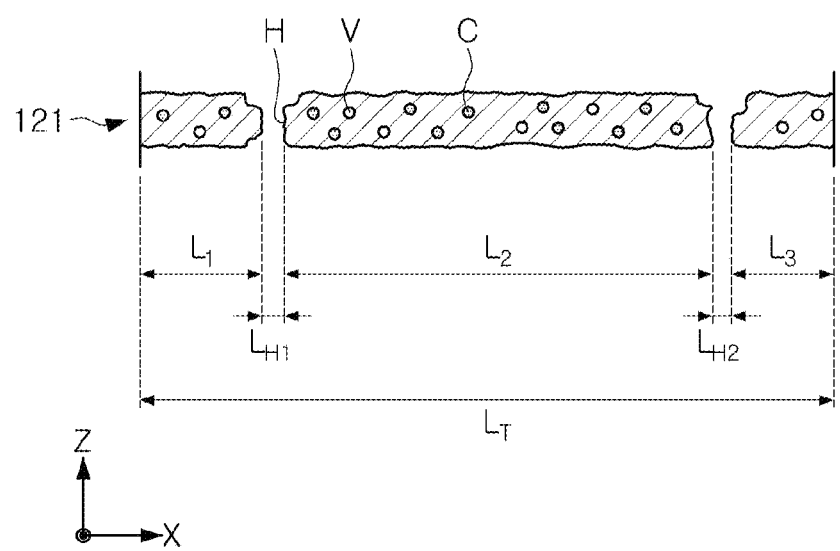
FIG. 4 is a schematic view illustrating a certain internal electrode layer.

FIG. 1 is a schematic perspective view of a capacitor component according to an exemplary embodiment of the present disclosure. FIG. 2 is a schematic cross-sectional view taken along line I-I' of FIG. 1. FIG. 3 is an enlarged view of portion "A" of FIG. 2. FIG. 4 is a schematic view illustrating a certain internal electrode layer.

Referring to FIGS. 1 to 4, a capacitor component 1000 according to the present embodiment may include a body 100 and external electrodes 210 and 220. The body 100 may include a dielectric layer 110 and internal electrode layers 121 and 122.

The body 100 may form an exterior of the capacitor component 1000 according to the present embodiment. A shape of the body 100 is not limited to any particular shape, but as illustrated in the drawings, the body 100 may have a hexahedral shape or a shape similar thereto. Due to shrinkage of ceramic powder particles contained in the body 100 during a sintering process, the body 100 may not have a hexahedral shape having completely straight lines but may have a substantially hexahedral shape.

The body 100 may have a first surface 101 and a second surface 102 opposing each other in a thickness direction Z, a third surface 103 and a fourth surface 104 opposing each other in a length direction X, and a fifth surface 105 and a sixth surface 106 opposing each other in a width direction Y, based on FIGS. 1 and 2. Each of the third to sixth surfaces 103, 104, 105, and 106 of the body 100 may correspond to a wall surface of the body 100 connecting the first surface 101 and the second surface 102 of the body 100 to each other. Hereinafter, both end surfaces (one end surface and the other end surface) of the body 100 may refer to the third surface 103 and the fourth surface 104 of the body 110, respectively, and both side surfaces (one side surface and the other side surface) of the body 100 may refer to the fifth surface 105 and the sixth surface 106 of the body 100, respectively. In addition, one surface and the other surface of the body 100 may refer to the first surface 101 and the second surface 102 of the body 100, respectively. One surface of the body 100 may be used as a mounting surface when the capacitor component 1000 according to the present embodiment is mounted on a mounting board such as a printed circuit board (PCB).

The body 100 may include a dielectric layer 110 and first and second internal electrode layers 121 and 122 alternately disposed with the dielectric layer 110 interposed therebetween. Each of the dielectric layer 110, the first internal electrode layer 121, and the second internal electrode layer 122 may be provided as a plurality of layers. Hereinafter, the first and second internal electrode layers 121 and 122 will be collectively referred to as internal electrode layers 121 and 122, except for the case in which they are required to be distinguished from each other. Accordingly, the description of portions collectively referred to as the internal electrode layers 121 and 122 may be commonly applied to the first and second internal electrode layers 121 and 122.

A plurality of dielectric layers 110 constituting the body 100 are in a sintered state and may be integrated, such that boundaries therebetween may not be readily apparent without using a scanning electron microscope (SEM).

A material forming the dielectric layers 110 is not limited as long as sufficient capacitance may be obtained therewith and may be, for example, barium titanate ($BaTiO_3$) powder. The material forming the dielectric layers 110 may include various additives, organic solvents, plasticizers, binders, dispersants, and the like, added to the $BaTiO_3$ powder, or the like, according to the purpose of the present disclosure.

A cover layer 130 may be disposed on upper and lower portions of the body 100, for example, both end portions of the body 100 in the thickness direction (the Z direction). The cover layer 130 may serve to maintain reliability of the capacitor component against external impacts. The cover layer 130 may be formed using a material for forming the dielectric layer 110, or a material different from the material for forming the dielectric layer 110. For example, in the latter case, the material for forming the dielectric layer 110 and the material for forming the cover layer 130 are different in terms of at least one of a composition, a size, a content, and dispersion degree of ceramic particles in the material, or at least one of a composition, a size, a content, and dispersion degree of sub-components in the material.

The internal electrode layers 121 and 122 may be disposed alternately with the dielectric layer 110, and may include first and second internal electrode layers 121 and 122. The first and second internal electrode layers 121 and 122 may be alternately disposed to face each other with the respective dielectric layer 110 interposed therebetween, and may be exposed to (or be in contact with or extend from) the third and fourth surfaces 103 and 104 of the body 100, respectively.

The internal electrode layers 121 and 122 may have a shape similar to an overall plate shape. In FIGS. 3 and 4, each of the internal electrode layers 121 and 122 is illustrated as including a plurality of internal electrode layers spaced apart from each other. However, this is because each of FIGS. 3 and 4 illustrates a cross-section of the body 100. The internal electrode layers 121 and 122 may be integrated members in which only one or more holes H to be described later is formed to penetrate through the internal electrode layers 121 and 122.

The internal electrode layers 121 and 122 may be alternately exposed to the third surface 103 and the fourth surface 104, both end surfaces of the body 100 in the length direction X, respectively, to be connected to the first and second external electrodes 210 and 220. For example, the first internal electrode layer 121 may be exposed to (or be in contact with or extend from) the third surface 103 of the body 100 so as to be connected to the first external electrode 210, and may not be exposed to (or be in contact with or extend from) the fourth surface 104 of the body 100 so as not to be connected to the second external electrode 220. The second internal electrode layer 122 may be exposed to (or be in contact with or extend from) the fourth surface 104 of the body 100 so as to be connected to the second external electrode 220, and may not be exposed to (or be in contact with or extend from) the third surface 103 of the body 100 so as not to be connected to the first external electrode 210. Accordingly, the first internal electrode layer 121 may be spaced apart from the fourth surface 104 of the body 100 by a predetermined distance, and the second internal electrode layer 122 may be spaced apart from the third surface 103 of the body 100 by a predetermined distance. In this case, the internal electrode layers 121 and 122 may be electrically insulated from each other by the dielectric layer 110 disposed therebetween.

The internal electrode layers 121 and 122 may include nickel (Ni), zirconium (Zr), and germanium (Ge). As an example, the internal electrode layers 121 and 122 may include a nickel (Ni)-zirconium (Zr)-germanium (Ge) alloy. As an example, each of the internal electrode layers 121 and 122 may include first powder particles may be formed of a conductive paste including at least one of palladium (Pd), silver (Ag), nickel (Ni), and copper (Cu), second powder particles including zirconium (Zr), and third powder particles including germanium (Ge). As an example, in the conductive paste, the second powder particles including zirconium (Zr) may be contained in an amount of 2.5 wt % or more to 3.5 wt % or less with respect to a mass of nickel (Ni) of the first powder particles, and the third powder particles including germanium (Ge) may be contained in an amount of 2.0 wt % or more to 3.0 wt % or less with respect to the mass of nickel (Ni) of the first powder particles, but the scope of the present disclosure is not limited thereto. In one example, a ratio of a sum of the masses of zirconium (Zr) and germanium (Ge) to the total mass of nickel (Ni) in the conductive paste may be 4.0 wt % or more and 4.5 wt % or less.

A ratio of the sum of contents (at %) of zirconium (Zr) and germanium (Ge) to the entire metal content in the first and second internal electrode layers 121 and 122 may be 3.3 at % or more to 3.7 at % or less. When the ratio of the sum of the contents of zirconium (Zr) and germanium (Ge) to the entire metal content in the internal electrode layers 121 and 122 is less than 3.3 at % or more than 3.7 at %, an effect of improving connectivity of an internal electrode layer to be described later may be insignificant.

The content (at %) of germanium (Ge) contained in the internal electrode layers 121 and 122 may be greater than the content (at %) of zirconium (Zr) contained in the internal electrode layers 121 and 122. However, when a difference between the two contents is large, the effect of improving the connectivity of the internal electrode layer may be insignificant. Therefore, the difference between the two contents may be, in detail, about 0.1 at %. In another example, the difference between the two contents may be 0.1 at % or less.

A ratio of the sum of the contents (at %) of zirconium (Zr) and germanium (Ge) contained in the internal electrode layers 121 and 122 to the content (at %) of nickel (Ni) contained in the internal electrode layers 121 and 122 may be 3.8 at % or more to 4.3 at % or less. When the ratio is less than 3.8 at % or greater than 4.3 at %, the effect of improving the connectivity of the internal electrode layer to be described later may be insignificant.

A determination may be made as to whether each of the internal electrode layers 121 and 122 include nickel (Ni), zirconium (Zr), and germanium (Ge) and the contents thereof may be determined, through a transmission electron microscope (TEM). For example, as illustrated in FIG. 3, it may be confirmed that when scanning for nickel (Ni) elements, scanning for zirconium (Zr) elements, and scanning for germanium (Ge) elements are performed on a region corresponding to a cross-section of the internal electrode layers 121 and 122 in a length direction X and a thickness direction Z (an X-Z cross-section) taken in a central portion in a width direction, the corresponding region contains nickel (Ni), zirconium (Zr) and germanium (Ge), and the contents thereof may be determined. Alternatively, a determination may be made as to whether each of the internal electrode layers 121 and 122 includes nickel (Ni), zirconium (Zr), and germanium (Ge) and the contents thereof may be determined by performing ICP analysis. For example, the determination may be made by polishing an external electrode to be removed from a capacitor component, pulverizing a body including a dielectric layer and an internal electrode layer to prepare primary powder particles, extracting an internal electrode layer component from the primary powder particles using a magnet, and performing inductively coupled plasma-mass spectroscopy (ICP-MS) on the powder particles extracted using the magnet. In addition, the determinations may be made as to whether the internal electrode layers 121 and 122 include a nickel-zirconium-germanium (Ni—Zr—Ge) alloy, using X-ray diffraction analysis (XRD).

Conventionally, an internal electrode layer may be formed by printing a conductive paste for forming an internal electrode on a dielectric green sheet, laminating and cutting a plurality of green sheets to manufacture a multilayer body, a green chip, and sintering the multilayer body. In general, a conductive paste and a dielectric green sheet for forming an internal electrode layer include not only metal powder particles such as nickel (Ni) and dielectric ceramic powder particles such as barium titanate, but also organic materials such as a dispersant, a binder, and a solvent. As capacitance of a component is increased, a thickness of an internal electrode layer should be reduced. Accordingly, when metal powder particles such as nickel, or the like, added to the conductive paste for forming an internal electrode are decreased in size, a sintering initiation temperature may move to a low-temperature region, and thus, a difference between the sintering initiation temperature of the metal powder particles for forming an internal electrode and a sintering initiation temperature of ceramic powder particles for forming a dielectric layer may be increased. For this reason, connectivity of the internal electrode layer may be deteriorated after sintering. As a result, capacitance of a component may be decreased and reliability may be deteriorated.

In the case of the capacitor component 1000 according to the present disclosure, the above-described issues may be addressed by adding not only first powder particles containing nickel (Ni) but also second powder particles containing zirconium (Zr) and germanium (Ge) together to a conventional conductive paste for forming an internal electrode layer. For example, the second powder particles containing zirconium (Zr) and the third powder containing germanium (Ge) may be added to the conductive paste for forming the internal electrode layer, and thus, a sintering initiation temperature for forming an internal electrode layer may be moved to a relatively high-temperature region in a heat treatment process such as a sintering process. Accordingly, the connectivity of the internal electrode layers 121 and 122 may be improved. As a result, capacitance of the capacitor component 1000 according to the present embodiment may be increased and moisture resistance reliability of the capacitor component 1000 according to the present embodiment may be improved.

The internal electrode layers 121 and 122 may have thicknesses T1 and T2, respectively. Each of the thicknesses T1 and T2 may be 10 nm or more to 500 nm or less. When each of the thicknesses T1 and T2 of the internal electrode layers 121 and 122 is less than 10 nm, the connectivity of the internal electrode layers 121 and 122 may be deteriorated to decrease the capacitance. When each of the thicknesses T1 and T2 of the internal electrode layers 121 and 122 is greater than 500 nm, the dielectric layer 110 may be formed to have a low thickness based on a component having the same size, so that it may be difficult to electrically insulate the internal electrode layers 121 and 122 from each other.

The thicknesses T1 and T2 of the internal electrode layers 121 and 122 may be measured using an optical image or an SEM image obtained by scanning an X-Z cross-section in which the capacitor component is taken in a central portion in the width direction Y. As an example, the thickness of the internal electrode layers 121 and 122 may refer to a value obtained by selecting one of the internal electrode layers 121 and 122 illustrated in the image, measuring a dimension of the selected internal electrode in the Z direction two or more times, and arithmetically averaging the measured dimensions. The measuring of the dimension two or more times may be performed at regular intervals, but exemplary embodiments are not limited thereto. In addition, the thickness of the internal electrode layers 121 and 122 may refer to a value obtained by calculating a thickness of each of the internal electrode layers 121 and 122, illustrated in the imaged, in the above-described method, and dividing the calculated thickness by the total number of electrode layers 121 and 122.

The internal electrode layers 121 and 122 may further include barium (Ba) and titanium (Ti). As an example, ceramic particles C may be disposed in the internal electrode layers 121 and 122. The ceramic particles C may be formed by adding ceramic powder particles such as barium titanate (BaTiO$_3$) to the conductive paste for forming the internal electrode layer. Similar to a dielectric material of the dielectric layer 110, the ceramic particles C may include a barium titanate-based material. In this case, the reliability of the capacitor component according to the present embodiment may be improved. Voids V may be formed in the internal electrode layers 121 and 122. The void V may be formed due to diffusion and recrystallization during a sintering process of the conductive powder included in the conductive paste, or may be formed by removing an organic material such as a solvent included in the conductive paste during the sintering process, or may be formed by diffusing ceramic powder particles included in the conductive paste to the dielectric layer 110 during a sintering process. The voids V and the ceramic particles C may be different from holes H to be described later and non-conductive portions disposed in the holes H, in that they do not penetrate through the internal electrode layers 121 and 122.

A hole H may be formed in the internal electrode layers 121 and 122, and a non-conductive portion may be disposed in the hole H. The hole H may be a region in which the internal electrode layers 121 and 122 are disconnected, and may penetrate through the internal electrode layers 121 and 122. The non-conductive portion may be formed in the hole H. When the non-conductive portion includes a ceramic material having a composition similar to that of a dielectric material of the dielectric layer 110 and/or the ceramic particles C in the internal electrode layers 121 and 122, the non-conductive portion may connect two adjacent dielectric layers 110 to each other via one of the internal electrode layers 121 and 122. In this case, the non-conductive portion may improve the reliability of the capacitor component 1000 according to the present embodiment. In FIG. 3, the non-conductive portion formed in the hole H is illustrated as connecting adjacent dielectric layers 110 to each other, but this is only an example. As another example, the non-conductive portion formed in the hole H may be a void.

Referring to FIG. 4, in a cross-section of the body 100 taken in a thickness direction Z, a ratio of a length ($L_1$+$L_2$+$L_3$) of the internal electrode layers 121 and 122, except for a non-conductive portion, in a length direction to a total length $L_T$ of the internal electrode layers 121 and 122 in a length direction X may be 0.8 or more. The total length $L_T$ of the internal electrode layers 121 and 122 in the length direction X may refer to a sum total of lengths $L_1$, $L_2$, and $L_3$ of a region, in which connection of the internal electrode layers 121 and 122 is maintained, and lengths $L_{H1}$ and $L_{H2}$ of a region, in which the internal electrode layers 121 and 122 are disconnected, for example, the non-conductive portion. The ratio is related to the above-described connectivity of the internal electrode layers 121 and 122. When the ratio is less than 0.8, the connectivity of the internal electrode layers 121 and 122 may be deteriorated to decrease the capacitance.

The total thicknesses $L_T$ the internal electrode layers 121 and 122 may be measured using an optical image or an SEM image obtained by scanning an X-Z cross-section in which the capacitor component is taken in a central portion in the width direction Y. As an example, the total thickness $L_T$ of the internal electrode layers 121 and 122 may refer to a value obtained by selecting one of the internal electrode layers 121 and 122 illustrated in the image, measuring a dimension of the selected internal electrode in the Z direction two or more times, and arithmetically averaging the measured dimensions. The measuring of the dimension two or more times may be performed at regular intervals, but exemplary embodiments are not limited thereto. Alternatively, the total thickness $L_T$ of the internal electrode layers 121 and 122 may refer to an average value obtained by calculating a thickness of each of the internal electrodes 121 and 122, illustrated in the image, in the above-described method, and dividing the calculated thickness by the total number of electrode layers 121 and 122. The description of the method of measuring the total length $L_T$ of the internal electrode layers 121 and 122 in the X direction may be equally applied to the lengths $L_1$, $L_2$, and $L_3$ of the internal electrode layers 121 and 122, except for the non-conductive portion, in the X direction and the lengths $L_{H1}$ and $L_{H2}$ of the non-conductive portion in the X direction.

The external electrodes 210 and 220 may be disposed on the body 100 and may be connected to the internal electrode layers 121 and 122. As illustrated in FIGS. 1 and 2, the external electrodes 210 and 220 may include first and second external electrodes 210 and 220, respectively disposed on the third and fourth surfaces 103 and 104 of the body 100 to be connected to the first and second internal electrode layers 121 and 122.

The first and second external electrodes 210 and 220 may include first and second connection portions and first and second extension portions, respectively. The first and second connection portions may be disposed on the third and fourth surfaces 103 and 104 to be connected to the first and second internal electrode layers 121 and 122, respectively. The first and second extension portions may extend from the first and second connection portions to the first surface 101 of the body 100, respectively. The first and second extension portions may be disposed to be spaced apart from each other on the first surface 101 of the body 100. Each of the first and second extension portions may extend not only to the first surface 101 of the body 100, but also to the second, fifth, and sixth surfaces 102, 105 and 106 of the body 100. However, the scope of the present disclosure is not limited thereto. For example, as illustrated in FIG. 1, each of the external electrodes 210 and 220 may be of a normal-type electrode formed on five surfaces of the body 100, but exemplary embodiments are not limited thereto. Each of the external electrodes 210 and 220 may be an L-type electrode formed on two surfaces of the body 100, a C-type electrode formed on three surfaces of the body 100, or the like.

The external electrodes 210 and 220 may be formed of any material, as long as it has electrical conductivity, such as metal, and a specific material may be determined in consideration of electrical characteristics and structural stability. Furthermore, each of the external electrodes 210 and 220 may have a multilayer structure. For example, each of the external electrodes 210 and 220 may include a first layer and a second layer. The first layer may be formed by sintering a sintered conductive paste including a conductive metal and glass or curing a curable conductive paste including a conductive metal and a base resin, or may be formed by vapor deposition. The second layer may be a nickel (Ni) plating layer and a tin (Sn) plating layer sequentially formed on the first layer by a plating method.

In the present embodiment, a structure in which the capacitor component 100 has two external electrodes 210 and 220 has been described, but the number or shape of the external electrodes 210 and 220 may vary depending on the shape of the internal electrode layers 121 and 122 or the purposes.

Experimental Example

First powder particles containing nickel (Ni), second powder particles containing zirconium (Zr), and third powder particles containing germanium (Ge) were prepared.

A first conductive paste including only the first powder particles, among the first to third powder particles, was prepared, a second conductive paste including all of the first to third powder particles, among first to third powder particles, was prepared, a third conductive paste including only the first and second powder particles, among the first to third powder particles, was prepared, and a fourth conductive paste including only the first and third powder particles, among the first to third powders, was prepared.

In the second conductive paste, the second powder particles were contained such that a content of zirconium (Zr) was 3.0 wt % with respect to the first powder particles (nickel (Ni)), and the third powder particles were contained such that a content of germanium (Ge) was 2.5 wt % with respect to the first powder particles (nickel (Ni)).

In the third conductive paste, the second powder particles were contained such a content of that zirconium (Zr) was 5.5 wt % with respect to the first powder particles (nickel (Ni)).

In the fourth conductive paste, the third powder particles were contained such that a content of that germanium (Ge) was 5.5 wt % with respect to the first powder particles (nickel (Ni)).

Unsintered first to fourth green bodies were formed using the first to fourth conductive pastes as conductive pastes for forming an internal electrode. The unsintered first to fourth green bodies were sintered to manufacture a body.

In Experimental Example 1, an internal electrode layer was formed using the first conductive paste. In Experimental Example 2, an internal electrode layer was formed using the second conductive paste. In Experimental Example 3, an internal electrode layer was formed using the third conductive paste. In Experimental Example 4, an internal electrode layer was formed using the fourth conductive paste.

In Experimental Examples 1 to 4, the other conditions were the same, except for a condition concerning whether the above-described conductive paste for forming an internal electrode layer contains conductive powder particles. For example, the other conditions included i) a composition of a dielectric green sheet, ii) a composition and a content of ceramic powder particles included in the conductive paste for forming an internal electrode layer, iii) a size of a green body (L*W*T), iv) temperature-rising condition and sintering conditions such as a sintering atmosphere, and the like, v) the total number of dielectric layers, vi) the total number of internal electrode layers, vii) an average thickness of the internal electrode layer, viii) an average thickness of the dielectric layer, and ix) a composition and formation conditions of the external electrode. As an example, in all of Experimental Examples 1 to 4, an average thickness of each internal electrode layer was 480 nm, an average thickness of each dielectric layer was 550 nm, the total number of internal electrode layers was 287, and the size of the green body was L=785 μm, W=440 μm, T=430 μm, which were the same.

In Experimental Example 2 in which an internal electrode layer was formed using the second conductive paste, each element contained in the internal electrode layer was analyzed by the above-described ICP analysis.

As can be seen in Table 1, the internal electrode layer of Experimental Example 2 included all of Ni, Zr, and Ge, materials of the first to third powder particles.

TABLE 1

|  | at % |
|---|---|
| Ni | 86.6% |
| Ba | 4.7% |
| Ti | 5.2% |
| Zr | 1.7% |
| Ge | 1.8% |

Figure 5:
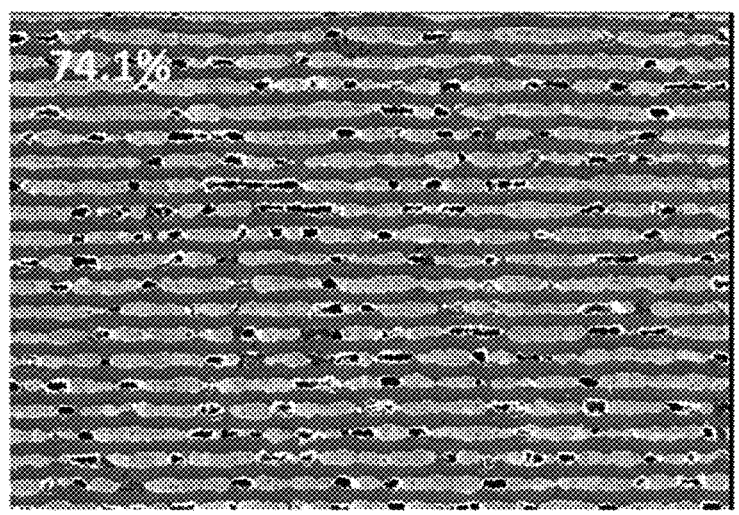
FIG. 5 is a scanning electron microscope (SEM) image illustrating a cross-section of Experimental Example 1.
Figure 6:
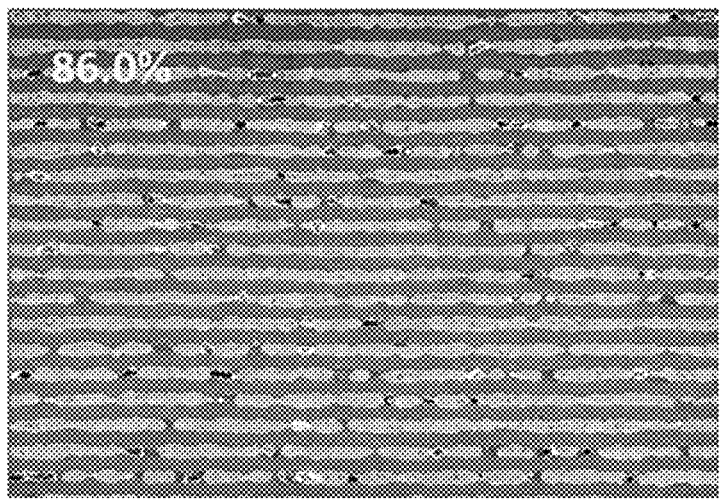
FIG. 6 is a SEM image illustrating a cross-section of Experimental Example 2.

FIG. 5 is an SEM image of a portion of a cross-section, taken from a central portion of a body of Experimental Example 1 in a width direction Y, in a length direction-a thickness direction (an X-Z cross-section), and FIG. 6 is an SEM image of a portion of a cross-section, taken from a central portion of a body of Experimental Example 2 in a width direction Y, in a length direction-a thickness direction (an X-Z cross-section). Connectivity of internal electrode layers in Experimental Examples 1 and 2 were calculated using the SEM images. In Experimental Example 1, the connectivity of the internal electrode layers was 74.1%, and in Experimental Example 2, the connectivity of the internal electrode layers was 86.0%. As a result, it can be seen that the connectivity of the internal electrode layers of Experimental Example 2 using the conductive paste for forming an internal electrode layer containing all of nickel (Ni) powder particles, zirconium (Zr) powder particles, and germanium (Ge) powder particles was improved by about 12%, as compared with the connectivity of the internal electrode layer of Experimental Example 1 using the first conductive paste containing only nickel (Ni) powder particles as conductive particles (86.0−74.1)/74.1*100=16.1%). This is considered to be because zirconium (Zr) and germanium (Ge) were added to nickel (Ni) to be helpful in delaying sintering shrinkage of nickel (Ni) in a high-temperature atmosphere.

Table 2 illustrates capacitances (unit: nF) of Experimental Examples 1 and 2, depending on sintering formation of bodies of Experimental Examples 1 and 2 while varying a sintering temperature T. In Table 2, the sintering temperature T may refer to a highest temperature in a sintering process.

As can be seen in Table 2, in Experimental Example 2 using the second conductive paste containing all of the nickel (Ni) powder, the zirconium (Zr) powder, and the germanium (Ge) powder, capacitance was improved, as compared with Experimental Example 1 sintered at the same sintering temperature to be formed. This is considered to be because as illustrated in FIGS. 5 and 6, Experimental Example 2 was helpful in improving the connectivity of the internal electrode layer, as compared with Experimental Example 1.

TABLE 2

| T | Experimental Example 1 | Experimental Example 2 |
|---|---|---|
| 1120° C. | 3.65 | 3.71 |
| 1130° C. | 3.74 | 3.83 |
| 1140° C. | 3.82 | 3.77 |

Figure 7:
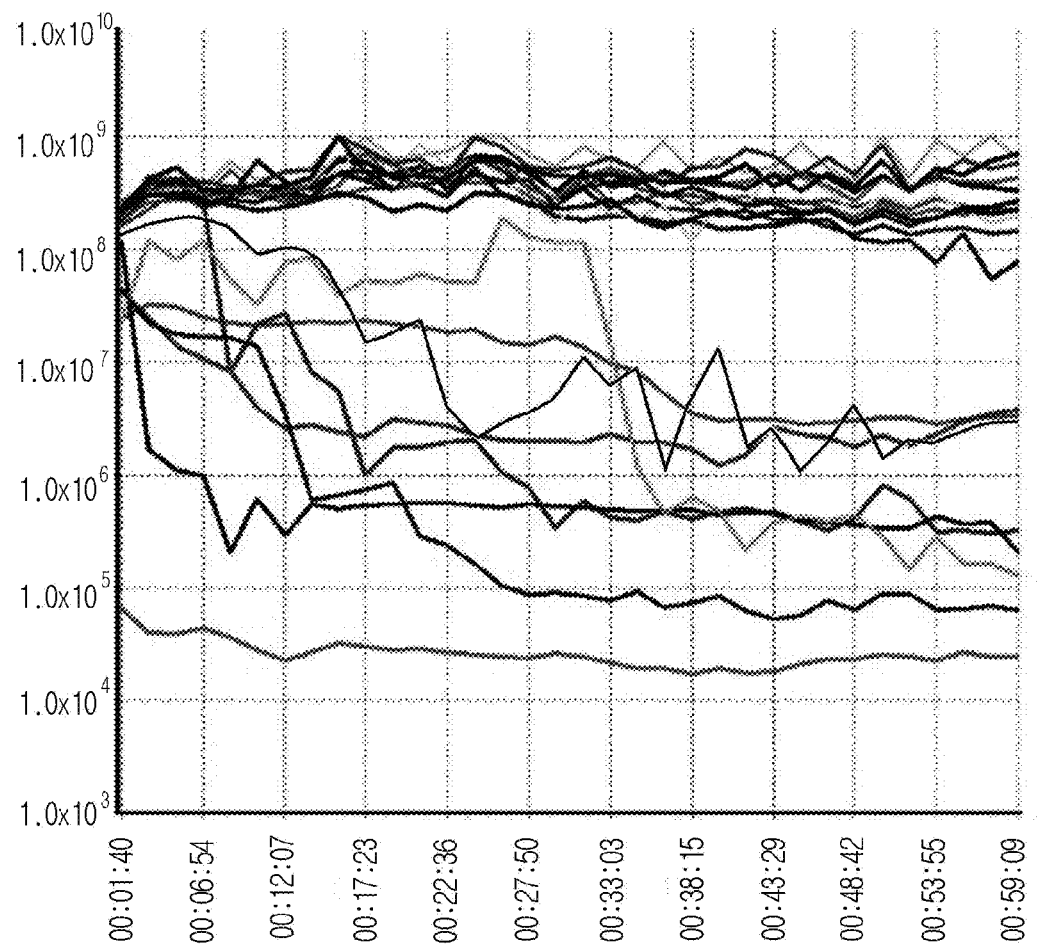
FIG. 7 is a view illustrating an evaluation result of moisture resistance reliability of Experimental Example 1.
Figure 8:
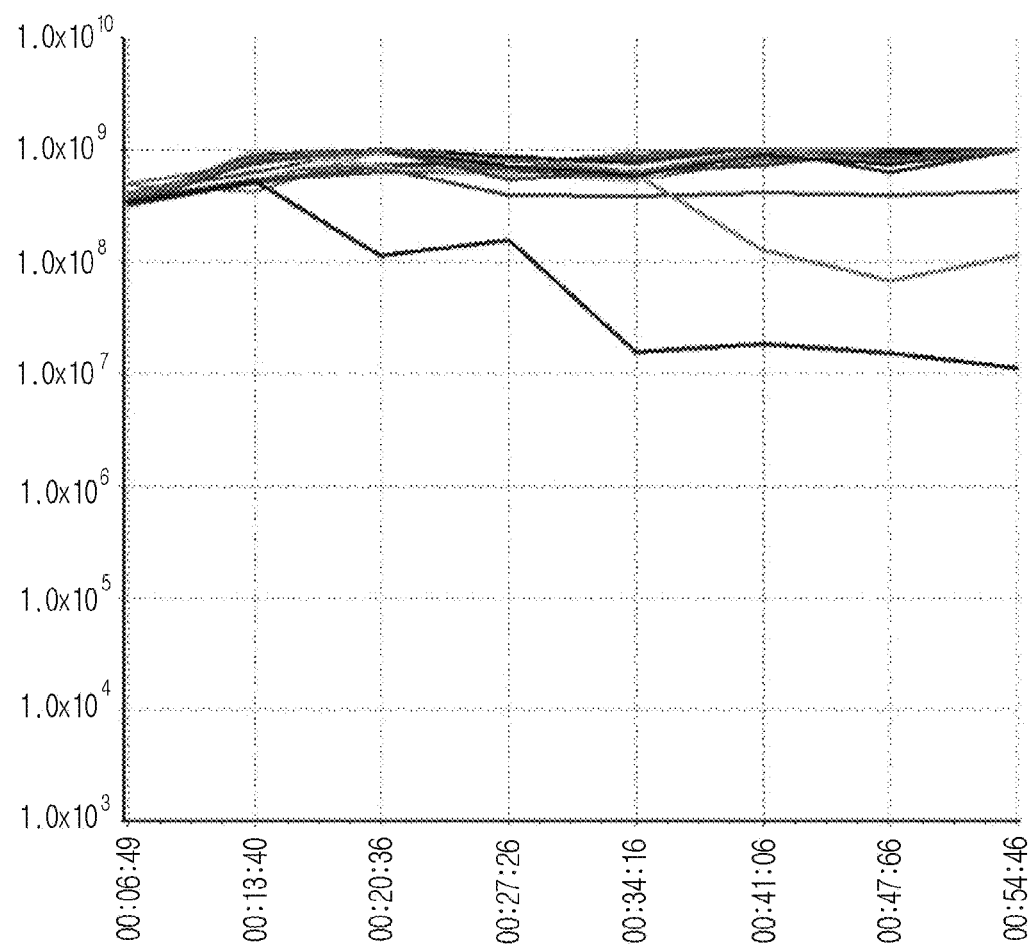
FIG. 8 is a diagram illustrating an evaluation result of moisture resistance reliability of Experimental Example 2.

FIGS. 7 and 8 illustrate results of evaluation (8585 evaluation) of moisture resistance reliability for Experimental Examples 1 and 2, respectively. The moisture resistance reliability was evaluated by measuring a change in insulation resistance "IR" depending on time "t" under test conditions of a temperature of 85° C., a relative humidity of 85%, and an applied voltage of 8V for 20 samples per each experimental example. In the case of Experimental Example 1 illustrated in FIG. 7, insulation resistances of a total of five samples were rapidly decreased (2 order or more (102 or more)) after 30 minutes, but in the case of Experimental Example 2 illustrated in FIG. 8, a rapid change in insulation resistances of all samples during the same period of time was not observed. This is considered to be because as illustrated in FIGS. 5 and 6, the interconnectivity of the internal electrode layer in Experimental Example 2 was improved, as compared with Experimental Example 1.

Table 3 illustrates measured defect rates (short %) for Experimental Examples 1 to 4.

A total of 100 samples for each experimental example were prepared, and a measurement voltage of 0.5 V and a frequency of 1 kHz were applied to the prepared samples. Under such experimental conditions, samples having capacitance of 3.2 µF or less or 4.2 µF or more were determined to be defective. Alternatively, samples having a dissipation factor (DF) of 0.04 or less or 0.07 or more were determined to be defective.

For each experimental example, the number of samples determined to be defective was represented as a percentage to be a defect rate (short %).

As can be seen in Table 3, in the case of Experimental Example 2 using the second conductive paste including all of the first to third powder particles, a defect rate was decreased, as compared with Experimental Examples 1, 3 and 4, not including at least one of the first to third powder particles. This is considered to be because as mentioned above, the connectivity of the internal electrode layer in Experimental Example 2 was improved.

TABLE 2

| | Experimental Example 1 | Experimental Example 2 | Experimental Example 3 | Experimental Example 4 |
|---|---|---|---|---|
| Defect Rate (short %) | 18.0 | 4.0 | 6.0 | 12.0 |

As described above, a capacitor component according to an aspect of the present disclosure may improve connectivity of an internal electrode layer.

A capacitor component according to another aspect of the present disclosure may increase capacitance.

A capacitor component according to another aspect of the present disclosure may improve moisture resistance reliability.

While exemplary embodiments have been shown and described above, it will be apparent to those skilled in the art that modifications and variations could be made without departing from the scope of the present disclosure as defined by the appended claims.

What is claimed is:

1. A capacitor component comprising:
a body including a dielectric layer and an internal electrode layer; and
an external electrode disposed on the body and connected to the internal electrode layer, wherein:
the internal electrode layer includes zirconium (Zr) and germanium (Ge); and
a ratio of a sum of contents (at %) of zirconium (Zr) and germanium (Ge), contained in the internal electrode layer, to an entirety of metal content in the internal electrode layer is 3.3 at % or more to 3.7 at % or less.

2. The capacitor component of claim 1, wherein:
a ratio of the contents (at %) of zirconium (Zr), contained in the internal electrode layer, to the entirety of the metal content in the internal electrode layer is 1.6 at % to more to 1.8 at % or less.

3. The capacitor component of claim 2, wherein:
a ratio of the contents (at %) of germanium (Ge), contained in the internal electrode layer, to the entirety of the metal content in the internal electrode layer is 1.7 at % to more to 1.9 at % or less.

4. The capacitor component of claim 2, wherein:
the content of germanium (Ge), contained in the internal electrode layer, is higher than the content of zirconium (Zr) contained in the internal electrode layer.

5. The capacitor component of claim 1, wherein:
the metal content in the internal electrode layer further contains nickel (Ni).

6. The capacitor component of claim 5, wherein:
the metal content in the internal electrode layer further contains barium (Ba) and titanium (Ti).

7. The capacitor component of claim 1, wherein:
a non-conductive portion in the internal electrode layer penetrates through the internal electrode layer; and
in a cross-section of the body taken in a first direction, a ratio of a length of the internal electrode layer in a second direction, perpendicular to the first direction, except for the non-conductive portion, to a total length of the internal electrode in the second direction is 0.8 or more.

8. The capacitor component of claim 1, wherein:
a ratio of the contents (at %) of germanium (Ge), contained in the internal electrode layer, to the entirety of the metal content in the internal electrode layer is 1.7 at % to more to 1.9 at % or less.

9. The capacitor component of claim 1, wherein:
the content of germanium (Ge), contained in the internal electrode layer, is higher than the content of zirconium (Zr) contained in the internal electrode layer.

10. A capacitor component comprising:
a body including a dielectric layer and an internal electrode layer; and
an external electrode disposed on the body and connected to the internal electrode layer, wherein:
the internal electrode layer includes a nickel (Ni)-zirconium (Zr)-germanium (Ge) alloy; and a ratio of a sum of contents (at %) of zirconium (Zr) and germanium (Ge), contained in the internal electrode layer, to a content (at %) of nickel (Ni), contained in the internal electrode layer, is 3.8 at % or more to 4.3 at % or less.

11. The capacitor component of claim 10, wherein:
the content (at %) of germanium (Ge), contained in the internal electrode layer, is higher than the content (at %) of zirconium (Zr) contained in the internal electrode layer.

12. The capacitor component of claim 10, wherein the internal electrode layer further contains barium (Ba) and titanium (Ti).

13. A method of manufacturing a capacitor component, the method comprising:
forming a dielectric green sheet; and
applying a conductive paste to the dielectric green sheet, the conductive paste including first powder particle including nickel (Ni), second powder particles including zirconium (Zr), and third powder particles including germanium (Ge).

14. The method of claim 13, wherein:
the second powder particles and the third powder particles are added such that a ratio of a sum of masses of zirconium (Zr) and germanium (Ge) to a total mass of nickel (Ni) in the conductive paste is 4.0 wt % or more and 4.5 wt % or less.

15. The method of claim 13, further comprising:
laminating the dielectric green sheet, to which the conductive paste is applied, two or more to form a multilayer body; and
sintering the multilayer body to form a body including a dielectric layer and an internal electrode layer.

16. The method of claim 15, wherein:
in the sintering the multilayer body to form the body, nickel (Ni), zirconium (Zr), and germanium (Ge) of the first to third powder particles form a nickel (Ni)-zirconium (Zr)-germanium (Ge) alloy.

17. A capacitor component comprising:
a body including a dielectric layer and an internal electrode layer; and
an external electrode disposed on the body and connected to the internal electrode layer, wherein:
the internal electrode layer includes zirconium (Zr) and germanium (Ge); and
a content of germanium (Ge), contained in the internal electrode layer, is higher than a content of zirconium (Zr) contained in the internal electrode layer.

18. The capacitor component of claim 17, wherein:
a ratio of the contents (at %) of zirconium (Zr), contained in the internal electrode layer, to a metal content in the internal electrode layer is 1.6 at % to more to 1.8 at % or less.

19. The capacitor component of claim 17, wherein:
a ratio of the contents (at %) of germanium (Ge), contained in the internal electrode layer, to a metal content in the internal electrode layer is 1.7 at % to more to 1.9 at % or less.

20. The capacitor component of claim 17, wherein:
the metal content in the internal electrode layer further contains nickel (Ni), barium (Ba) and titanium (Ti).

21. The capacitor component of claim 17, wherein:
a difference between the content of germanium (Ge) and the content of zirconium (Zr) is 0.1 at % or less.

* * * * *